US009229041B2

(12) United States Patent
Wang et al.

(10) Patent No.: US 9,229,041 B2
(45) Date of Patent: Jan. 5, 2016

(54) AUTOMATIC TEST SYSTEM

(71) Applicant: Cheng Uei Precision Industry Co., Ltd., New Taipei (TW)

(72) Inventors: Han Wei Wang, New Taipei (TW); Jung Kuang Liu, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 222 days.

(21) Appl. No.: 14/167,377

(22) Filed: Jan. 29, 2014

(65) Prior Publication Data

US 2015/0212142 A1 Jul. 30, 2015

(51) Int. Cl.
*G01R 31/20* (2006.01)
*G01R 31/04* (2006.01)
*G01M 99/00* (2011.01)

(52) U.S. Cl.
CPC ........... *G01R 31/043* (2013.01); *G01M 99/008* (2013.01)

(58) Field of Classification Search
CPC ............... G01R 31/01; G01R 31/2851; G01R 31/2887; G01R 31/2893; G11C 29/56
See application file for complete search history.

(56) References Cited

U.S. PATENT DOCUMENTS

| 7,541,828 | B2 * | 6/2009 | Kim | ............... | B07C 5/344 |
| | | | | | 324/750.05 |
| 8,305,104 | B2 * | 11/2012 | Garcia | ............... | G01R 31/01 |
| | | | | | 324/757.01 |
| 9,024,648 | B2 * | 5/2015 | Horino | ............... | G01R 1/02 |
| | | | | | 324/750.13 |

* cited by examiner

*Primary Examiner* — Minh N Tang
(74) *Attorney, Agent, or Firm* — WPAT, P.C.; Anthony King

(57) ABSTRACT

An automatic test system includes a mechanical frame, a test device mounted to the mechanical frame for testing the electrical performance and the mechanical performance of the connector, a packing device mounted to the mechanical frame for packing the connector which is completed to be tested, a transmission device mounted to the mechanical frame for transmitting the connector to each workstation of the test device and the packing device, a moving device mounted to the mechanical frame for moving the connector to each workstation of the test device and the packing device corresponding to the transmission device, and a control system electrically connected with and controlling the test device, the packing device, the transmission device and the moving device for completing the transmission, test and packing action of the connector.

20 Claims, 18 Drawing Sheets

AUTOMATIC TEST SYSTEM

BACKGROUND OF THE INVENTION

1. Field of the Invention

The present invention generally relates to a test system, and more particularly to an automatic test system.

2. The Related Art

As is known to all, connectors are widely used in a variety of electronic products, such as cell phones, MP3, MP4, notebooks and so on. With electronic products being developed towards a high precision direction, the connectors are required to develop towards the high precision and miniaturized direction. So, after the connectors are completed being manufactured, the connectors are needed to proceed a series of corresponding mechanical performance test of the connector. Currently, the connectors are respectively placed on each test workstation one by one in manual to proceed the corresponding mechanical performance test. In order to save test time and human power, a conventional automatic test system is invented and applied to proceed the mechanical performance test of the connector.

However, with the development of the technology, a photoelectric sensor is assembled to the connector, so the corresponding automatic test system should have the mechanical performance test function and the electrical performance test function. The above-mentioned automatic test system of the connector just has the mechanical performance test function, and the connector is tested in the manual test way that results in a human cost and a test time waste. And it's apt to make operators generate a fatigue feeling to affect the test stability of the connector on account of the connector being tested in the manual test way, so that a quality of the connector is lowered. Furthermore, the connector is tested by virtue of the conventional automatic test system, though the human cost and the test time waste are saved, and the test stability of the connector is strengthened, the conventional automatic test system is just able to proceed the single performance test of the connector that dissatisfies the test requirement.

SUMMARY OF THE INVENTION

An object of the present invention is to provide an automatic test system for testing a connector. The automatic test system includes a mechanical frame, a test device mounted to the mechanical frame for testing the electrical performance and the mechanical performance of the connector, a packing device mounted to the mechanical frame for packing the connector which is completed to be tested, a transmission device mounted to the mechanical frame for transmitting the connector to each workstation of the test device and the packing device, a moving device mounted to the mechanical frame for moving the connector to each workstation of the test device and the packing device corresponding to the transmission device, and a control system electrically connected with and controlling the test device, the packing device, the transmission device and the moving device for completing the transmission, test and packing action of the connector.

As described above, the automatic test system proceeds the automatic test for the connector by virtue of electrical test devices and mechanical test devices of the test device so as to improve a test stability of the connector and improve a test quality of the connector. Furthermore, the automatic test system is able to proceed multiterm performance tests for saving manpower and test time for lowering a test cost.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
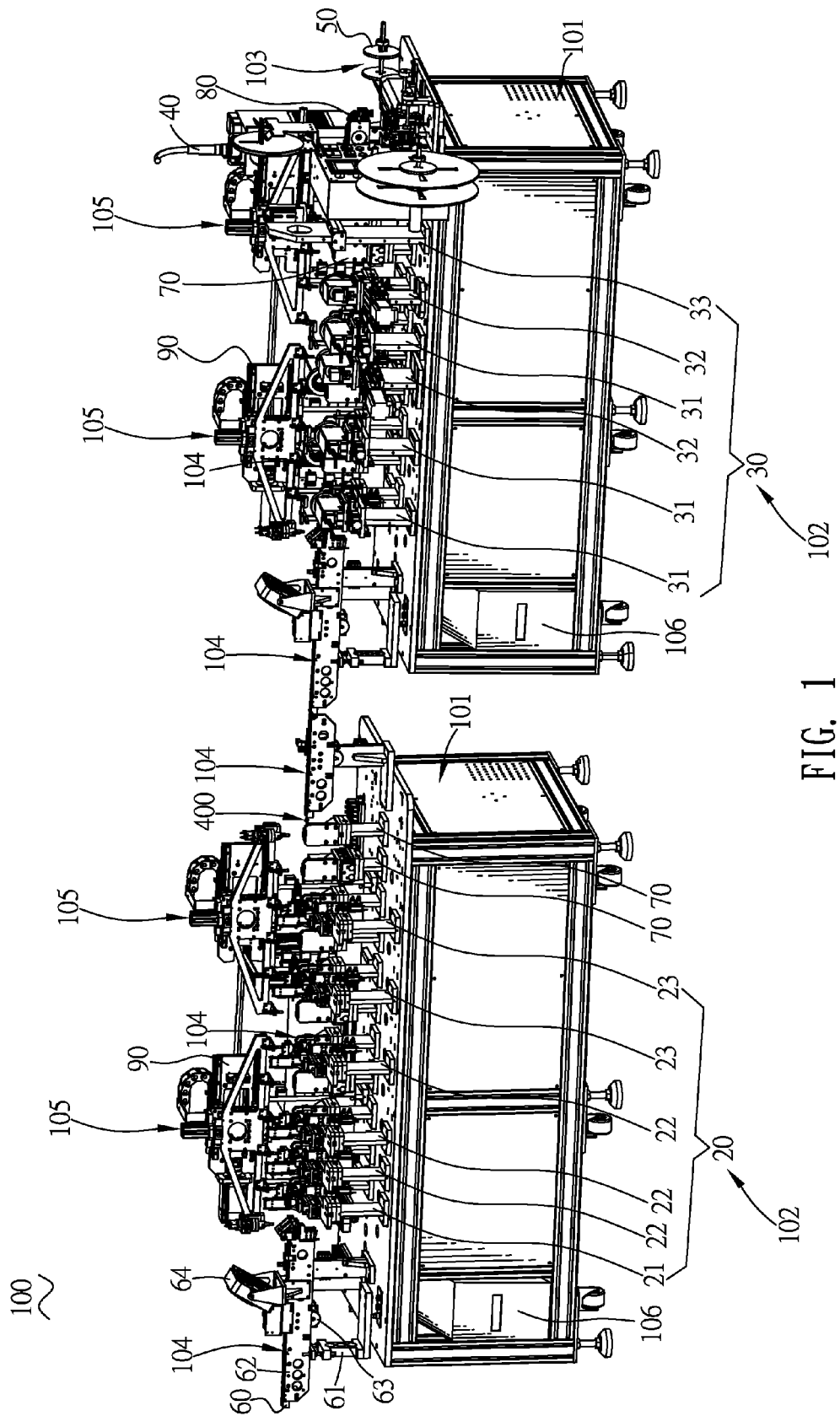
FIG. 1 is a perspective view of an automatic test system in accordance with an embodiment of the present invention.
Figure 2:
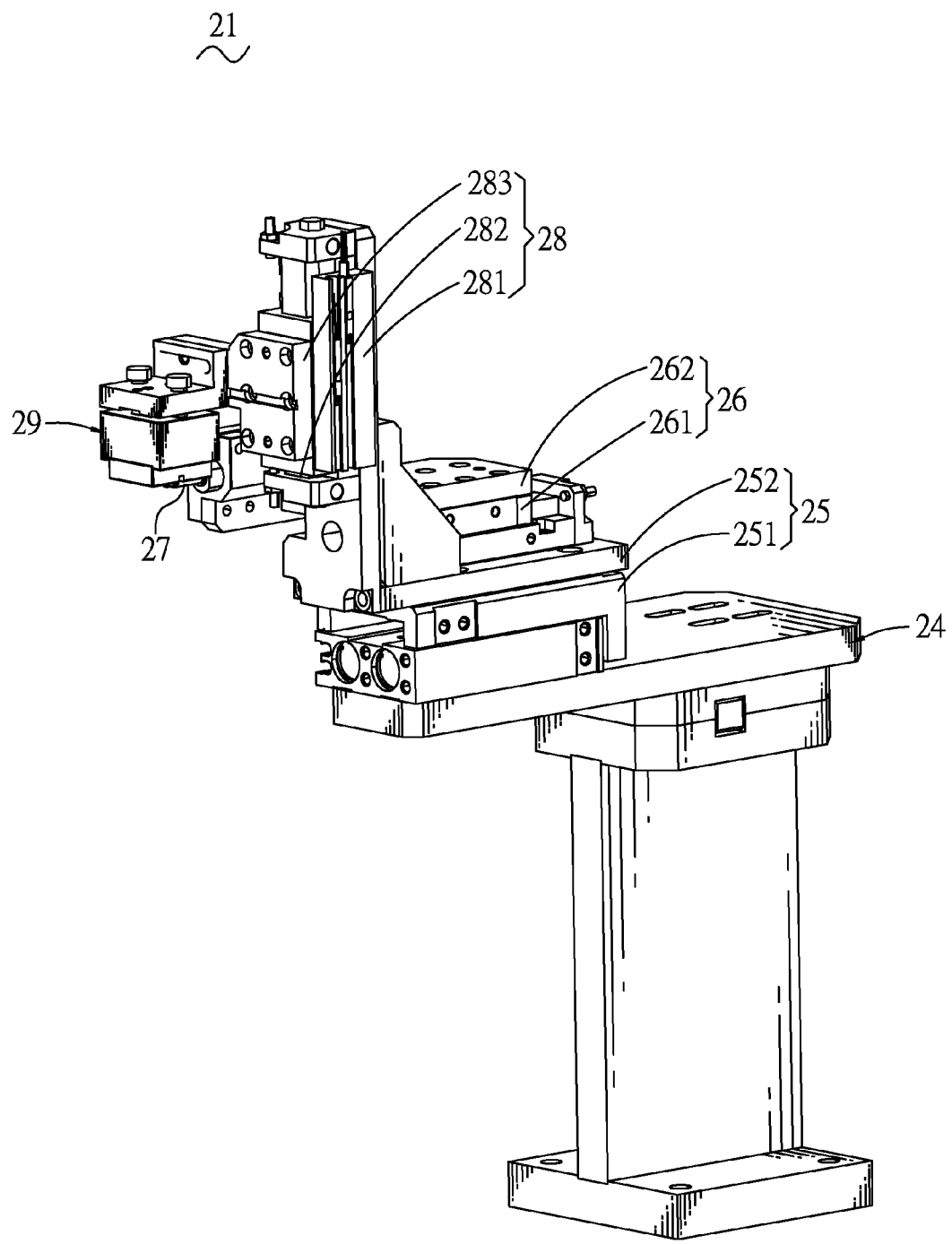
FIG. 2 is a perspective view of a first electrical test device of the automatic test system of FIG. 1.

With reference to FIG. 1 and FIG. 2, an automatic test system 100 in accordance with an embodiment of the present invention is shown. The automatic test system 100 adapted for testing an electrical performance and a mechanical performance of a connector 400, includes a mechanical frame 101, a test device 102, a packing device 103, a transmission device 104, a moving device 105 and a control system 106.

The test device 102 is mounted to the mechanical frame 101 for testing the electrical performance and the mechanical performance of the connector 400. The packing device 103 is mounted to the mechanical frame 101 for packing the connector 400 which is completed to be tested. The transmission device 104 is mounted to the mechanical frame 101 for transmitting the connector 400 to each workstation of the test device 102 and the packing device 103. The moving device 105 is mounted to the mechanical frame 101 for moving the connector 400 to each workstation of the test device 102 and the packing device 103 corresponding to the transmission device 104. The control system 106 is electrically connected with and controls the test device 102, the packing device 103, the transmission device 104 and the moving device 105 for completing the transmission, test and packing action of the connector 400. In this embodiment, the connector 400 is an audio receptacle connector, and includes an insulating housing 401, a plurality of first terminals 402, second terminals 403, third terminals 404, fourth terminals 405 and a light emitting diode 406 disposed to the insulating housing 401. The connector 400 defines an insertion hole 407.

Referring to FIG. 1, the test device 102 includes a plurality of electrical test devices 20 and mechanical test devices 30. In this embodiment, the electrical test devices 20 and the mechanical test devices 30 are disposed to the mechanical frame 101 in sequence to make the connector 400 proceed the electrical performance test first and then the mechanical performance test. The packing device 103 includes a packing mechanism 50 mounted to a top surface of the mechanical frame 101 and located at a right side of the test device 102. The moving device 105 located in rear of the transmission device 104 includes a plurality of suction nozzle modules 90. In this embodiment, in order to facilitate the control system 106 for acquiring and controlling test datum, the automatic test system 100 includes two mechanical frames 101. The electrical test devices 20 and the mechanical test devices 30 are respectively disposed on one of the mechanical frames 101 in sequence. The automatic test system 100 proceeds automatic test for the connector 400 by virtue of the electrical test devices 20 and the mechanical test devices 30 of the test device 102.

The transmission device 104 includes a plurality of transmission mechanisms 60 and a plurality of transfer platforms 70. The transfer platforms 70 are disposed in rear of the test device 102 and located at a left side of the packing device 103. Each of the transfer platforms 70 is corresponding to each workstation of the test device 102. The transmission mechanisms 60 are mounted on the top surface of the mechanical frame 101. The transmission mechanisms 60 are respectively located on a right side and a left side of the top surface of the mechanical frame 101 where the electrical test devices 20 are disposed, and located on the left side of the top surface of the mechanical frame 101 where the mechanical test devices 30 are disposed. The moving device 105 is disposed in rear of the transfer platforms 70.

Referring to FIG. 1 to FIG. 4, the electrical test devices 20 include at least one first electrical test device 21, at least one second electrical test device 22 and at least one third electrical test device 23. In this embodiment, the electrical test devices 20 include one first electrical test device 21, three second electrical test device 22 and two third electrical test devices 23 according to different electrical performances needed be tested. Each of the electrical test devices 20 includes a test platform 24 mounted on the top surface of the mechanical frame 101, a first longitudinal transporting mechanism 25 slidably assembled to a top of the test platform 24, a second longitudinal transporting mechanism 26 slidably assembled to one side of a top of the first longitudinal transporting mechanism 25, a docking component 27 assembled to a rear of the second longitudinal transporting mechanism 26, a vertical transporting mechanism 28 slidably assembled to the other side of the top of the first longitudinal transporting mechanism 25, and an electrical test assembly 29 assembled to the vertical transporting mechanism 28.

Specifically, the first longitudinal transporting mechanism 25 includes a first sliding cylinder 251 disposed on a top surface of the test platform 24, and a first fastening board 252 disposed on a top of the first sliding cylinder 251. The second longitudinal transporting mechanism 26 includes a second sliding cylinder 261 disposed on a top surface of the first fastening board 252, a second fastening board 262 disposed on a top of the second sliding cylinder 261, and a docking element 27 fastened to one side of a rear of the second fastening board 262 by virtue of a fastening element (not shown). The vertical transporting mechanism 28 includes a vertical fastening board 281 fastened to the other side of the first fastening board 252, a vertical sliding cylinder 282 disposed to a rear surface of the vertical fastening board 281, and a third fastening board 283 disposed to a rear of the vertical sliding cylinder 282. In this embodiment, the connector 400 is an audio receptacle connector, and the docking element 27 of the test device 102 is an audio plug.

In use, the first sliding cylinder 251 of the first longitudinal transporting mechanism 25 drives the first fastening board 252 to slide rearward so as to bring along the second longitudinal transporting mechanism 26, the docking element 27, the vertical transporting mechanism 28 and the electrical test assembly 29 together slide rearward to be located above the corresponding transfer platform 70. The second sliding cylinder 261 of the second longitudinal transporting mechanism 26 drives the second fastening board 262 to slide rearward so as to bring along the docking element 27 fastened to one side of a rear of the second fastening board 262 to interconnect with the connector 400 fastened to the transfer platform 70. The vertical fastening board 281 of the vertical transporting mechanism 28 drives the third fastening board 283 to slide downward to bring along the electrical test assembly 29 to contact the connector 400 to start the electrical performance test.

Preferably, in other preferred embodiment, the electrical test assembly 29 is able to be modulated according to a quantity of the electrical test devices 20 and an arranging sequence of the electrical test devices 20.

Referring to FIG. 2, in this embodiment, the first electrical test devices 21 are respectively for proceeding an insertion-withdrawal performance test of the connector 400, and the electrical test assembly 29 of the first electrical test devices 21 is fastened to one side of the third fastening board 283 and located above the docking element 27. So the connector 400 is tightly clamped between the corresponding electrical test assembly 29 fastened to one side of the third fastening board 283 and the transfer platform 70.

Figure 3:
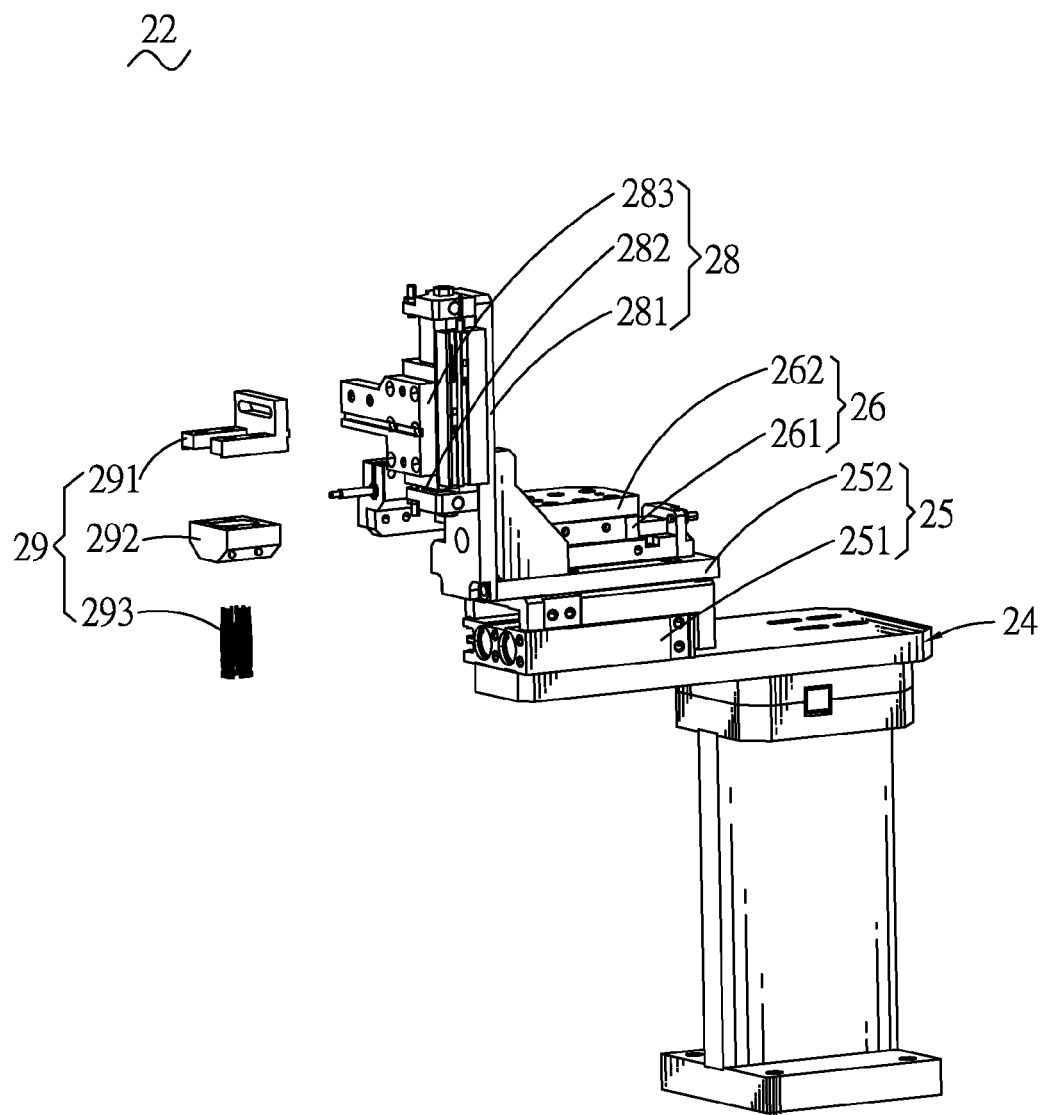
FIG. 3 is an exploded view of a second electrical test device of the automatic test system of FIG. 1.

Referring to FIG. 3, in this embodiment, the three second electrical test devices 22 are respectively for proceeding a conduction performance test, a high-voltage insulation test and a light emitting diode electricity test. The electrical test assembly 29 of the second electrical test device 22 includes a fastening component 291 fastened to the one side of the third fastening board 283, a probe holder 292 fastened under the fastening component 291, and a plurality of probes 293 fastened to the probe holder 292 and exposed beyond a top of the probe holder 292.

Figure 4:
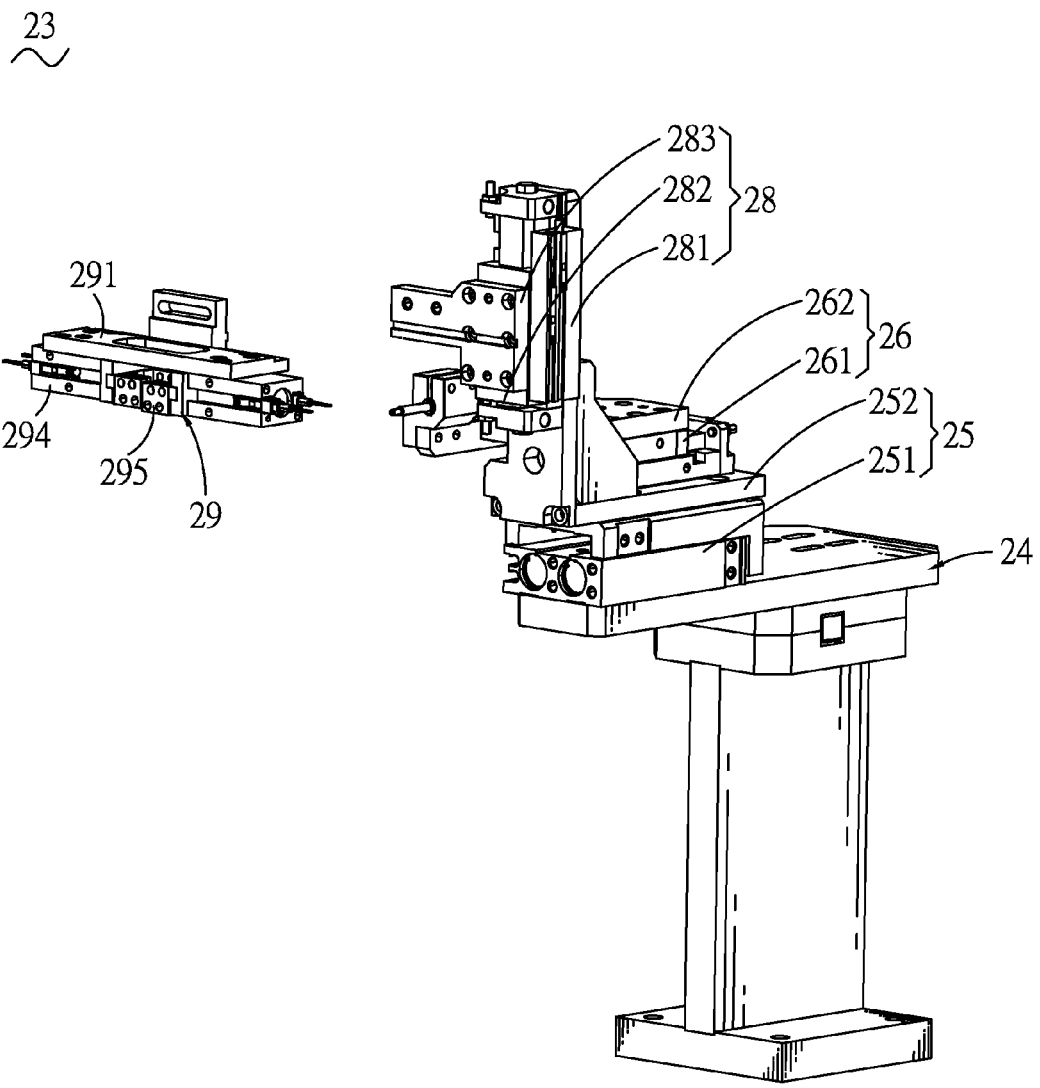
FIG. 4 is an exploded view of a third electrical test device of the automatic test system of FIG. 1.

Referring to FIG. 4, in this embodiment, the two third electrical test devices 23 are respectively for proceeding a resistance test of the connector 400. The electrical test assembly 29 of the third electrical test device 23 includes a fastening component 291 fastened to the one side of the third fastening board 283, two third sliding cylinders 294 disposed to two opposite sides of a bottom of the fastening component 291, and a plurality of clamping portions 295 disposed between the two third sliding cylinders 294.

Figure 5:
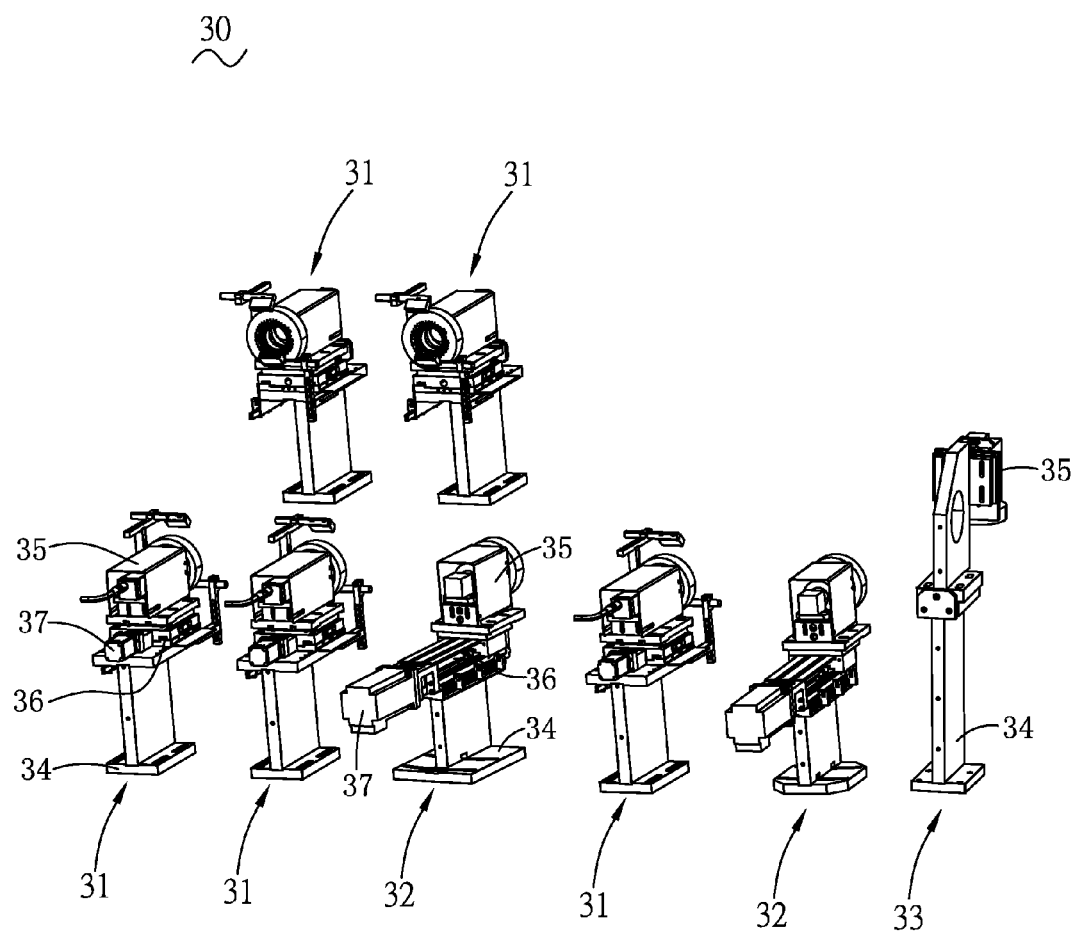
FIG. 5 is an exploded view of a mechanical test device of the automatic test system of FIG. 1.

Referring to FIG. 5, the mechanical test devices 30 for photographing an image of the connector 400, include at least one first mechanical test device 31, at least one second mechanical test device 32 and at least one third mechanical test device 33. In this embodiment, the mechanical test devices 30 for photographing an image of the connector 400, include five first mechanical test devices 31, two second mechanical test devices 32 and one third mechanical test device 33. Each of the mechanical test devices 30 includes a camera bracket 34 mounted to the mechanical frame 101, and a camera 35 disposed to the camera bracket 34. By virtue of the test need, each of the first mechanical test devices 31 and each of second mechanical test devices 32 respectively further include a ball bearing lead screw 36 connected with a front end of the camera 35, and a step motor 37 connected with a front end of the ball bearing lead screw 36. In other preferred embodiment, a quantity of the mechanical test devices 30 and an arranging sequence of the mechanical test devices 30 is capable of being modulated according to the mechanical performances needed be tested.

In use, the step motor 37 drives the ball bearing lead screw 36 to rotate to modulate a focal length of the camera 35 so as to modulate an image definition of each connector 400 which is photographed by the mechanical test device 30. The image of the connector 400 photographed by the mechanical test device 30 is able to proceed a dimension measurement and an appearance inspection of the connector 400 via the control system 106.

Figure 6:
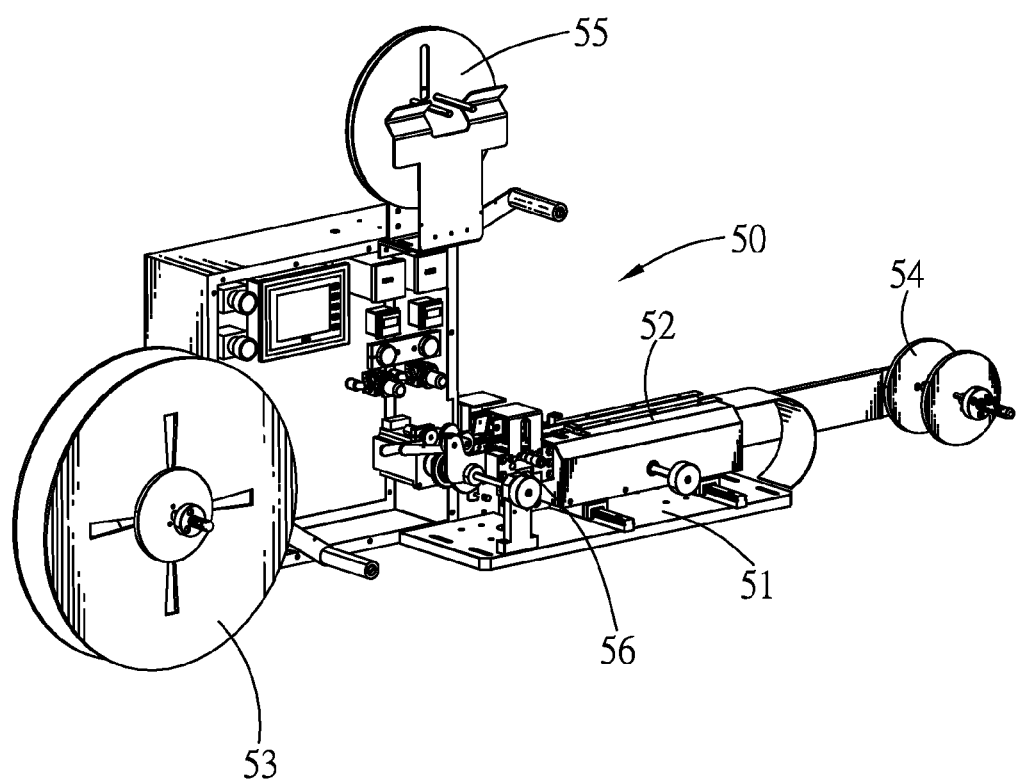
FIG. 6 is a perspective view of a packing mechanism of the automatic test system of FIG. 1.

Referring to FIG. 1 and FIG. 6, the packing mechanism 50 includes a panel portion 51 mounted to the mechanical frame 101, a packing platform 52 mounted to the panel portion 51, a receiving wheel 53 and a packing tape wheel 54 oppositely disposed in front and in rear of the packing platform 52, an adhesive tape wheel 55 disposed above the packing platform 52, the receiving wheel 53 and the packing tape wheel 54, and a pressing mechanism 56 disposed in front of the packing platform 52 and located among the packing platform 52, the receiving wheel 53 and the adhesive tape wheel 55. A material strap is looped around the packing tape wheel 54, and an adhesive tape is looped around the adhesive tape wheel 55.

In use, put a segment of material strap on the packing platform 52, the packing tape wheel 54 rotates, the material strap is transmitted forward along the packing platform 52, simultaneously, the adhesive tape wheel 55 transmits the adhesive tape downward to the pressing mechanism 56. The moving device 105 moves the connector 400 which is completed to be tested to the material strap, and then the material strap together with the connector 400 is transmitted to the pressing mechanism 56. The connector 400 is adhered between the material strap and the adhesive tape by virtue of the pressing mechanism 56 so as to complete a packing action of the connector 400. At last, the packing mechanism 50 continues transmitting the packed connector 400 forward to the receiving wheel 53 so as to loop the packed connectors 400 around the receiving wheel 53.

Referring to FIG. 1, each of the transmission mechanisms 60 includes a transmitting bracket assembly 61 mounted to the mechanical frame 101, a transmitting path 62 disposed above the transmitting bracket assembly 61, and a transmitting motor 63 disposed to one side of the transmitting bracket assembly 61 for driving the transmitting path 62. In order to ensure an accuracy of the test of the connector 400, the two transmission mechanisms 60 which are respectively located on the left side of the top surface of the mechanical frame 101 where the electrical test devices 20 are disposed, and located on the left side of the top surface of the mechanical frame 101 where the mechanical test devices 30 are disposed respectively further include a static fan 64 mounted above the transmitting bracket assembly 61 and spaced from a top of the transmitting bracket 61 and the transmitting path 62 for eliminating statics of the connector 400.

Figure 7:
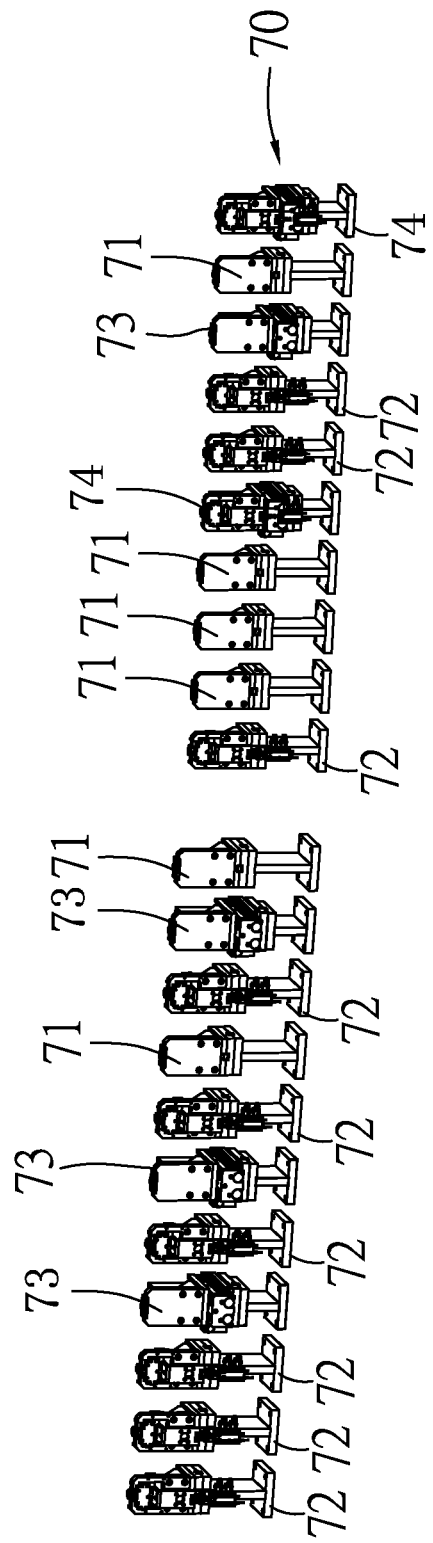
FIG. 7 is a perspective view of a transfer platform of the automatic test system of FIG. 1.

Referring to FIG. 1 and FIG. 7, the transfer platforms 70 include a plurality of first transfer platforms 71, a plurality of second transfer platforms 72, a plurality of third transfer platforms 73 and a plurality of fourth transfer platforms 74.

Figure 8:
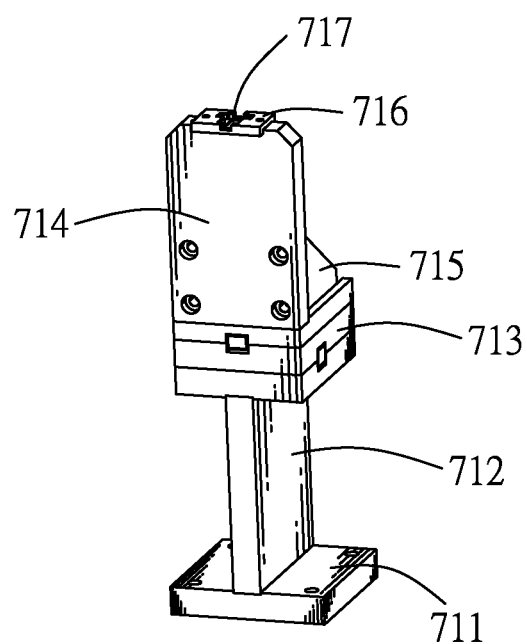
FIG. 8 is a perspective view of a first transfer platform of the automatic test system of FIG. 1.
Figure 9:
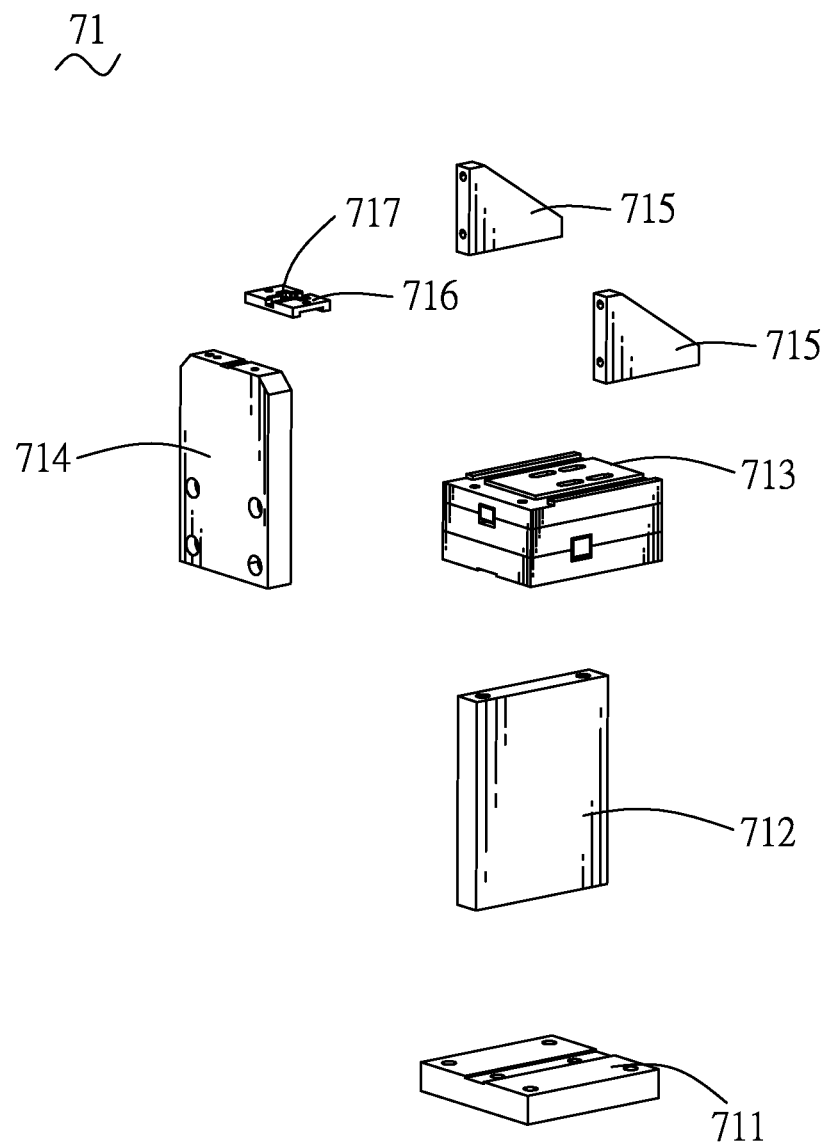
FIG. 9 is an exploded view of the first transfer platform of the automatic test system of FIG. 1.

Referring to FIG. 8 and FIG. 9, each of the first transfer platforms 71 has a first bottom board 711, a first connecting board 712 disposed above the first bottom board 711, a first bearing platform 713 disposed above the first connecting board 712, a first blocking board 714 disposed above a front end of the first bearing platform 713, two first buckling boards 715 disposed to two opposite sides of the first bearing platform 713 and located in rear of the first blocking board 714, and a first locating board 716 disposed above the first blocking board 716. A top of the first blocking board 716 defines a first locating groove 717 for locating the connector 400.

Figure 10:
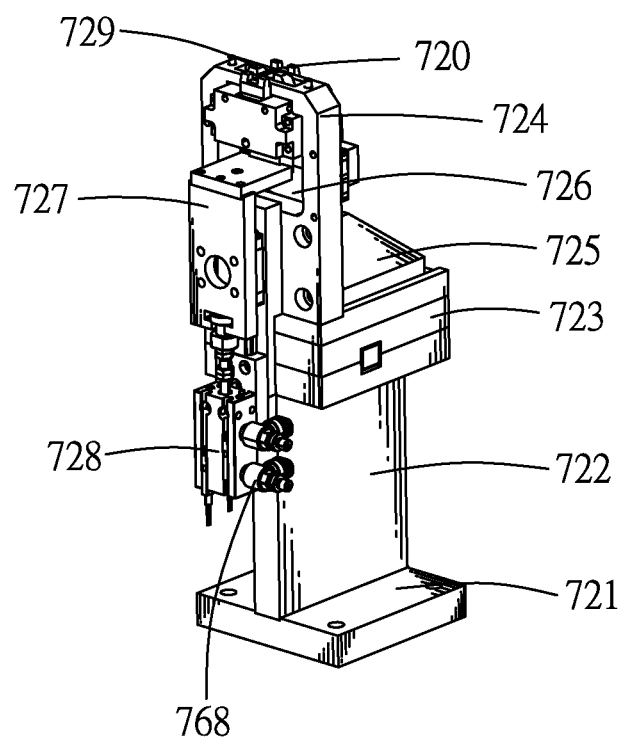
FIG. 10 is a perspective view of a second transfer platform of the automatic test system of FIG. 1.
Figure 11:
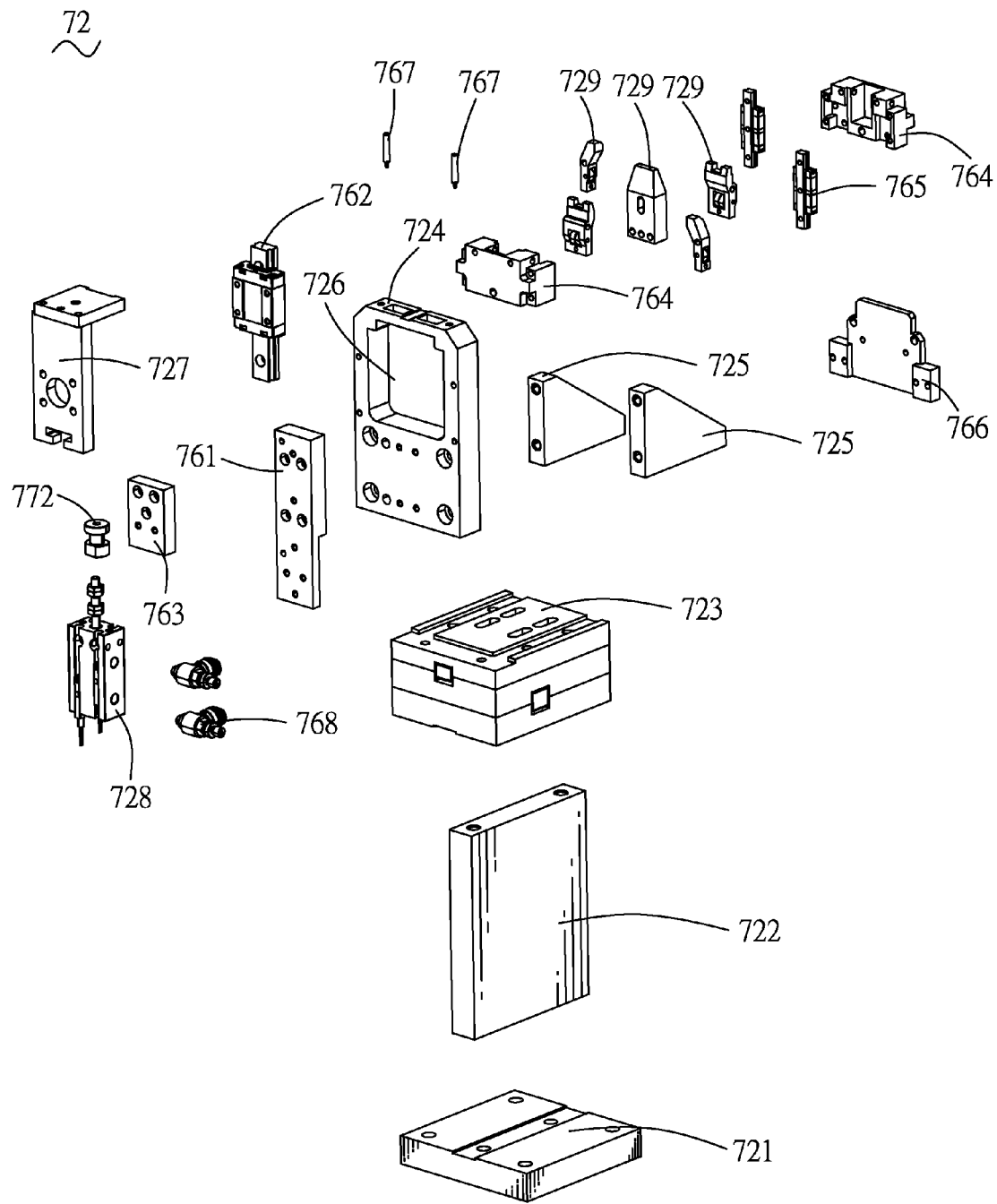
FIG. 11 is an exploded view of the second transfer platform of the automatic test system of FIG. 1.

Referring to FIG. 10 and FIG. 11, each of the second transfer platforms 72 has a second bottom board 721, a second connecting board 722 disposed above the second bottom board 721, a second bearing platform 723 disposed above the second connecting board 722, a second blocking board 724 disposed above a front end of the second bearing platform 723, two second buckling boards 725 disposed to two opposite sides of the second bearing platform 723 and located in rear of the second blocking board 724, a top of the second blocking board 724 defines a first fastening groove 726, a first holding board 761 disposed in front of the second blocking board 724, a first guiding mechanism 762 disposed in front of the first holding board 761 and able to slide upward and downward, a second holding board 763 disposed in front of the first holding board 761 and located under the first guiding mechanism 762, a first pushing element 727 disposed in front of the second holding board 763 and fastened to the first guiding mechanism 762 with a top thereof projecting into the first fastening groove 726, a first piston cylinder 728 disposed under the first pushing element 727 and located in front of the second holding board 763, a first connecting element 771 connected between the first pushing element 727 and the first piston cylinder 728, a plurality of first embedding elements 729 disposed around a top of the second blocking board 724 and partially projecting into the first fastening groove 726, two first blocking blocks 764 respectively disposed to a front and a rear of the first embedding elements 729 and interconnected with each other, two second guiding mechanisms 765 respectively disposed in rear of the second blocking board 724, located between the two first blocking blocks 764 and able to slide upward and downward, and a second blocking block 766 disposed in rear of the first blocking blocks 764. The second transfer platform 72 further includes two ejecting pins 767 disposed to two opposite sides of a top of the second blocking board 724, and two first intake tubes 768 connected to one side of the first piston cylinder 728. Tops of the first embedding elements 729 surround a second locating groove 720 for locating the connector 400.

The first piston cylinder 728 drives the first pushing element 727 and the first guiding mechanism 762 to move upward and downward to make the first pushing element 727 push the first embedding elements 729, the first blocking blocks 764 and the second blocking block 766 to move upward and downward. The first guiding mechanism 762 guides the first pushing element 727 to move along a straight line. The second guiding mechanisms 765 guide the first blocking blocks 764 and the second blocking block 766 to move along a straight line.

Figure 12:
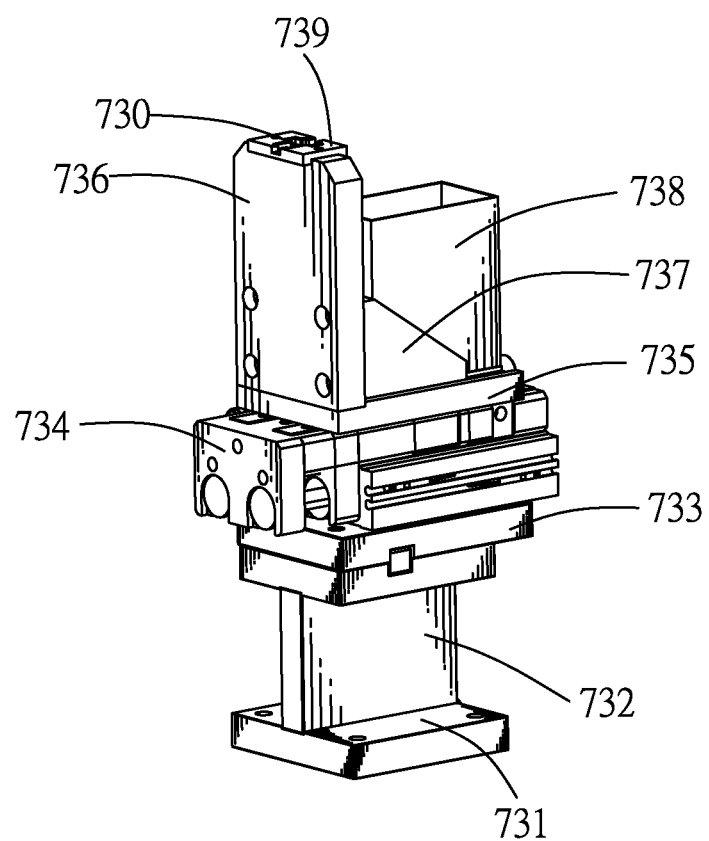
FIG. 12 is a perspective view of a third transfer platform of the automatic test system of FIG. 1.
Figure 13:
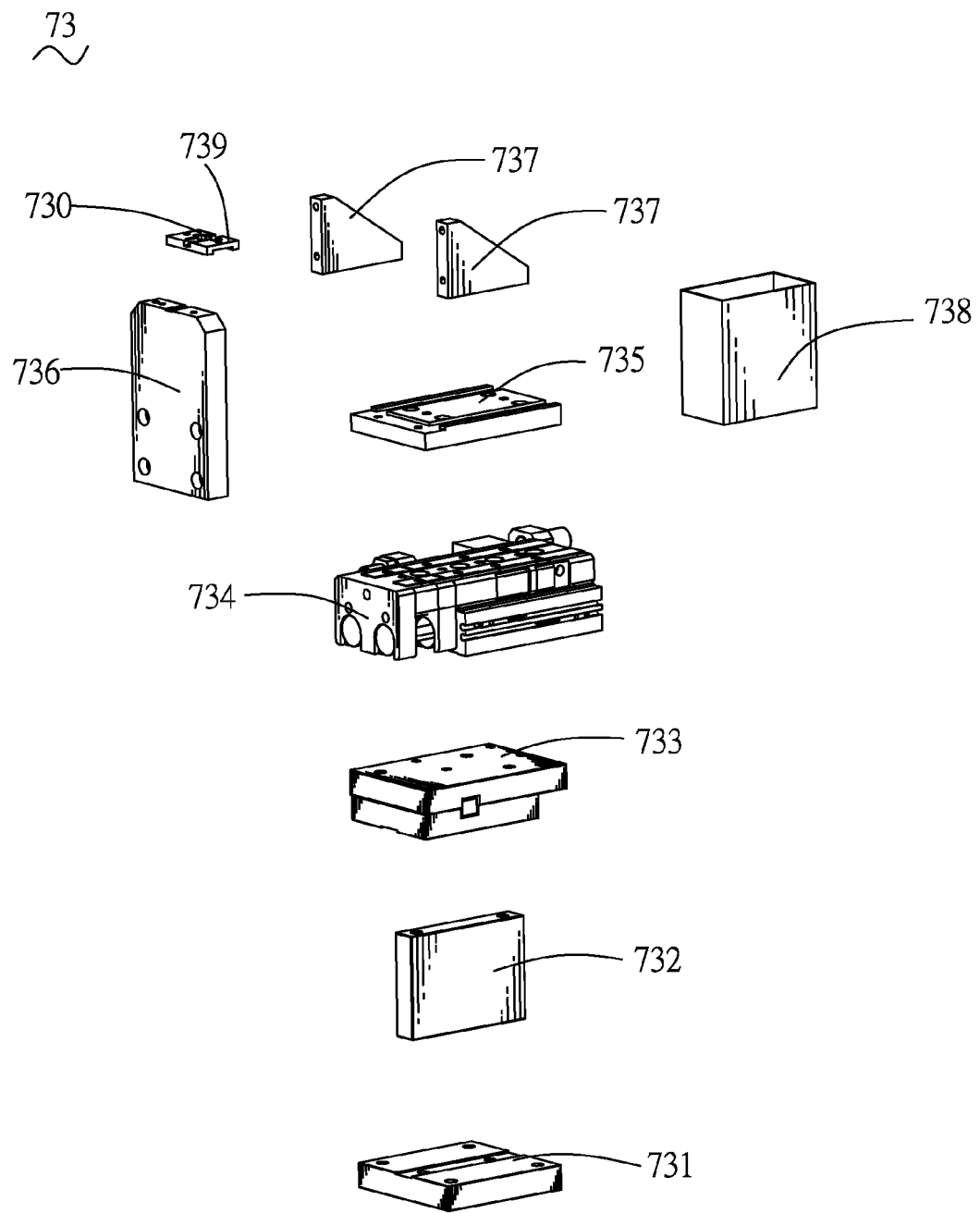
FIG. 13 is an exploded view of the third transfer platform of the automatic test system of FIG. 1.

Referring to FIG. 12 and FIG. 13, each of the third transfer platforms 73 has a third bottom board 731, a third connecting board 732 disposed above the third bottom board 731, a third bearing platform 733 disposed above the third connecting board 732, a second sliding cylinder 734 disposed above the third bearing platform 733, a first retaining board 735 disposed above the second sliding cylinder 734, a third blocking board 736 disposed above a front end of the first retaining board 735, two third buckling boards 737 disposed to two opposite sides of the first retaining board 735 and located in rear of the third blocking board 736, a first collecting box 738 disposed above first retaining board 735, and located between the two third buckling boards 737 and located in rear of the third blocking board 736, and a third locating board 739 disposed above the third blocking board 736. A top of the third locating board 739 defines a third locating groove 730 for locating the connector 400. The second sliding cylinder 734 is able to slide forward and rearward along the third bearing platform 733 to make defective connectors 400 collected in the first collecting box 738.

Figure 14:
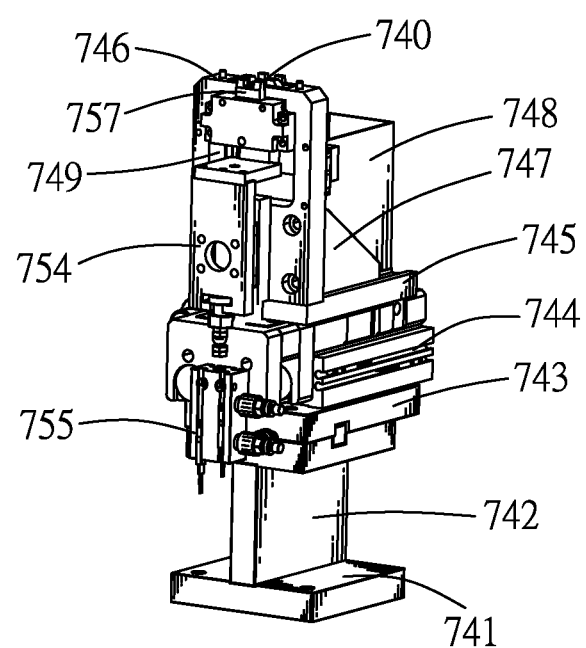
FIG. 14 is a perspective view of a fourth transfer platform of the automatic test system of FIG. 1.
Figure 15:
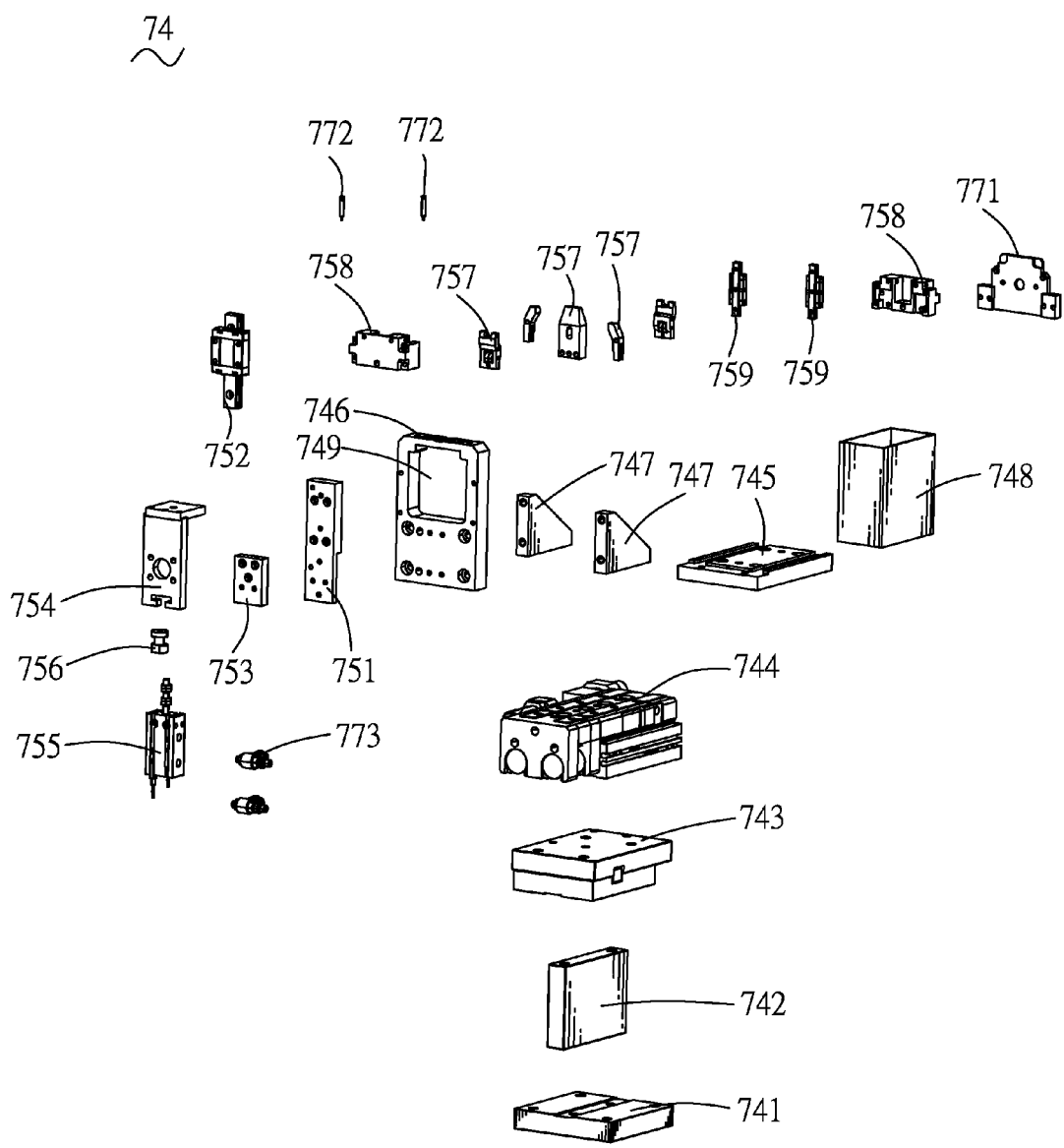
FIG. 15 is an exploded view of the fourth transfer platform of the automatic test system of FIG. 1.

Referring to FIG. 14 and FIG. 15, each of the fourth transfer platforms 74 has a fourth bottom board 741, a fourth connecting board 742 disposed above the fourth bottom board 741, a fourth bearing platform 743 disposed above the fourth connecting board 742, a second sliding cylinder 744 disposed above the fourth bearing platform 743, a second retaining board 745 disposed above the second sliding cylinder 744, a fourth blocking board 746 disposed above a front end of the second retaining board 745, two fourth buckling boards 747 disposed to two sides of the second retaining board 745, a second collecting box 748 disposed above the second retaining board 745, and located between the two fourth buckling boards 747 and located in rear of the fourth blocking board 746, a top of the fourth blocking board 746 defines a second fastening groove 749, a third holding board 751 disposed in front of the fourth blocking board 746, a third guiding mechanism 752 disposed in front of the third holding board 751 and able to slide upward and downward, a third fastening board 753 disposed in front of the third holding board 751 and located under the third guiding mechanism 752, a second pushing element 754 disposed in front of the third holding board 751 and fastened to third guiding mechanism 752 with a top thereof projecting into the second fastening groove 749, a second piston cylinder 755 disposed under the second pushing element 754 and located in front of the third fastening board 753, a second connecting element 756 connected between the second pushing element 754 and the second piston cylinder 755, a plurality of second embedding elements 757 disposed around a top of the second blocking board 724 and partially projecting into the first fastening groove 726, two third blocking blocks 758 respectively disposed in front of and in rear of the second embedding elements 757, and interconnected with each other, two fourth guiding mechanisms 759 disposed in rear of the fourth blocking board 746 and located between the two third blocking blocks 758, and able to slide upward and downward, and a fourth blocking block 771 disposed in rear of the second embedding elements 757 and the third blocking blocks 758. The fourth transfer platform 74 further includes two second ejecting pins 772 disposed above two opposite sides of a top of the fourth blocking board 746, and two second intake tubes 773 connected with one side of the second piston cylinder 755. Tops of the second embedding elements 757 surround a fourth locating groove 740 for locating the connector 400.

The second piston cylinder 755 drives the third guiding mechanism 752 and the second pushing element 754 to move upward and downward to make the second pushing element 754 push the second embedding elements 757 and the third blocking blocks 758 to move upward and downward. The third guiding mechanism 752 guides the second pushing element 754 to move along a straight line. The fourth guiding mechanisms 759 guide the second embedding elements 757 and the third blocking blocks 758 to move along a straight line. The second sliding cylinder 744 slides forward and rearward to make the defective connectors 400 collected in the second collecting box 748.

Referring to FIG. 1, the packing device 103 further includes a laser device 40 which is connected with a laser equipment (not shown). The laser device 40 is disposed at a rear of the transmission device 104 adjacent to the packing mechanism 50 for lasering a date code on the connector 400.

Figure 16:
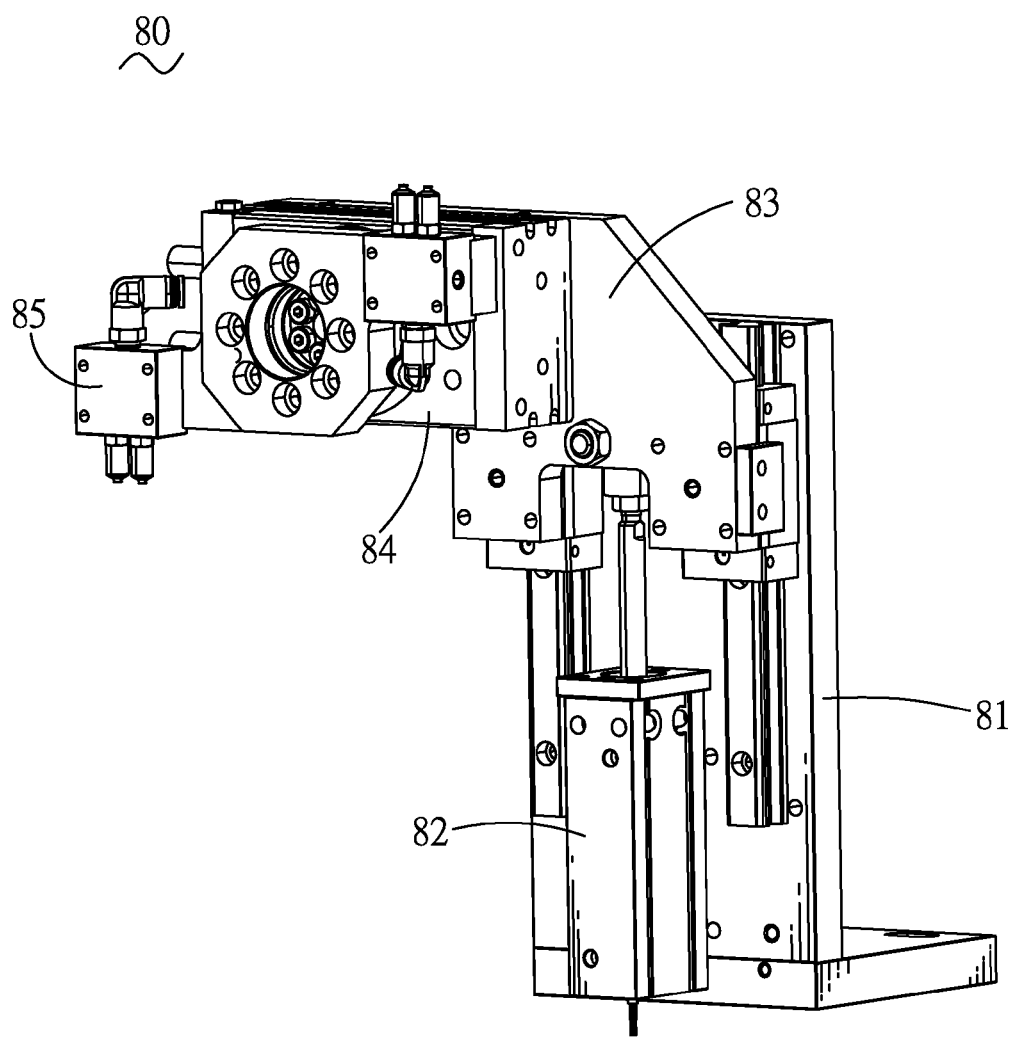
FIG. 16 is a perspective view of a transferring and placing mechanism of the automatic test system of FIG. 1.

Referring to FIG. 1 and FIG. 16, the transmission device 104 further includes a placing device 80 mounted to the mechanical frame 101 for receiving the connector 400 moved by the moving device 105 and further placing the connector 400 on the packing platform 52 of the packing mechanism 50. The placing device 80 is disposed between the right of the transfer platforms 70 corresponding to the mechanical test device 30 and the packing mechanism 50. The placing device 80 includes a mechanical supporter assembly 81 mounted to the mechanical frame 101, a vertical drive cylinder 82 disposed to the mechanical supporter assembly 81, a mechanical fastening board 83 connected to and driven by the vertical drive cylinder 82 to move upward and downward, a rotating drive mechanism 84 fastened to the mechanical fastening board 83, and a rotating mechanism 85 driven by the rotating drive mechanism 84 to rotate and place the connector 400.

In use, the vertical drive cylinder 82 drives the mechanical fastening board 83, the rotating drive mechanism 84 and the rotating mechanism 85 to move upward, the rotating mechanism 85 grabs the connector 400 which is completed to be tested and lasered. The rotating drive mechanism 84 drives the rotating mechanism 85 to rotate and then place the connector 400 which is completed to be tested and lasered on the packing platform 52 of the packing mechanism 50.

Figure 17:
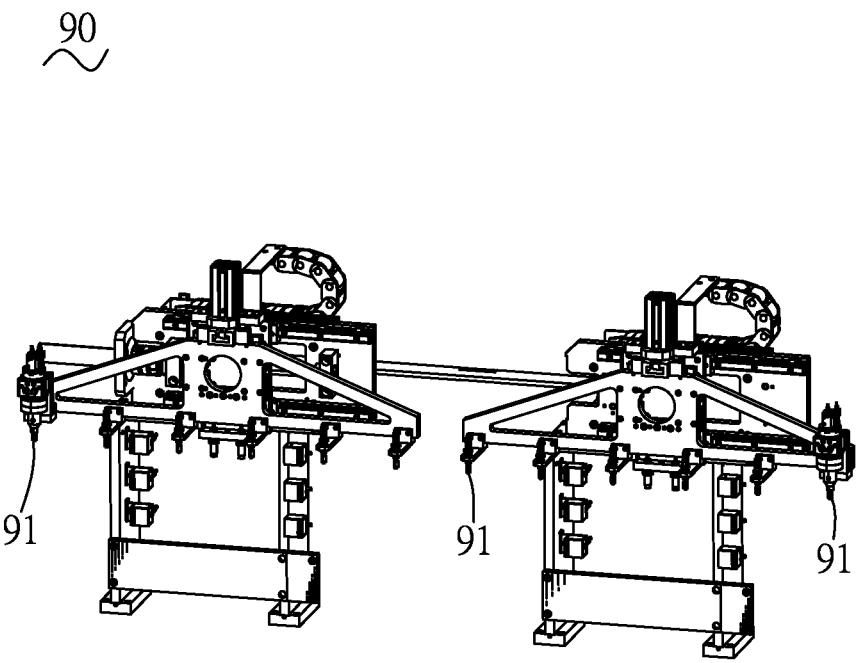
FIG. 17 is a partially perspective view of a moving device of the automatic test system of FIG. 1.
Figure 18:
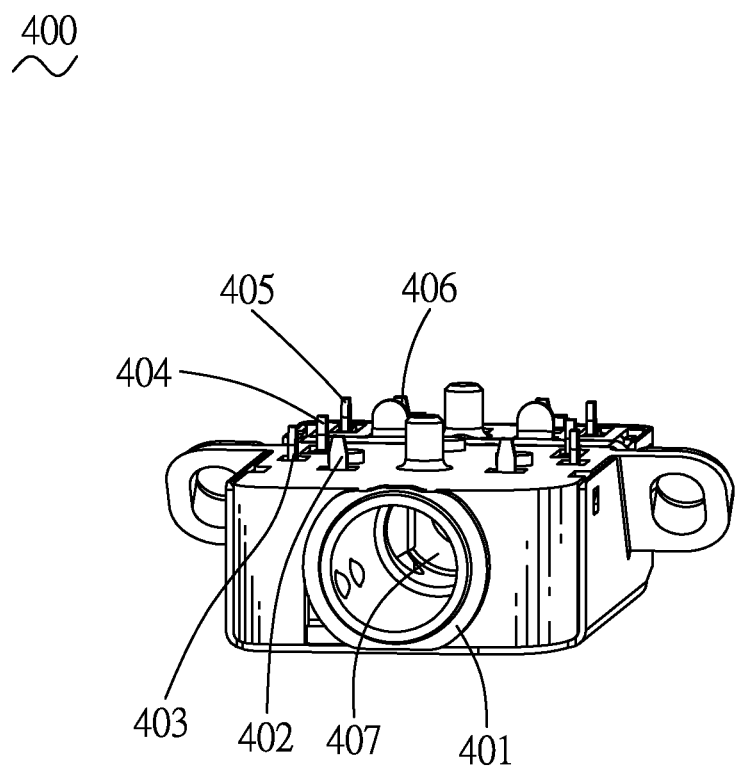
FIG. 18 is a perspective view of a connector tested by the automatic test system of FIG. 1.

Referring to FIG. 1 and FIG. 17, each of the suction nozzle modules 90 defines a plurality of suction nozzles 91 arranged at regular intervals. An interval between each two suction nozzles 91 is corresponding to a spaced distance between each two transfer platforms 70.

Referring to FIG. 1, FIG. 12 to FIG. 14, if the connector 400 which is completed to be tested is a good product, the suction nozzle modules 90 transfer the connector 400 to the next transfer platform 70. If the connector 400 which is completed to be tested is a defective product, the connector 400 which is completed to be tested is collected in the first collecting box 738 of the third transfer platform 73 or the second collecting box 748 of the fourth transfer platform 74.

Referring to FIG. 1 to FIG. 18, the automatic test system 100 is able to proceed multiterm performance tests. in this embodiment, the automatic test system 100 proceeds twenty-one workstation tests for the connector 400 from left to right in sequence. The automatic test system 100 proceeds from the first to the eleventh workstation electrical performance tests for the connector 400 on the transfer platforms 70. Specifically, the connectors 400 are placed on the transmitting path 62 of the transmission mechanism 60 which is located on the left side of the top surface of the mechanical frame 101 where the electrical test devices 20 are disposed in sequence, and the transmitting motor 63 drives the transmitting path 62 of the transmission mechanism 60 to transmit the connectors 400 rightward. At the moment, the suction nozzle modules 90 transfer the connectors 400 to the corresponding transfer platforms 70 in sequence to proceed the test.

The first workstation: the first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward. The suction nozzle modules 90 transfer the connectors 400 to the leftmost second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720.

The vertical sliding cylinder 282 of the first electrical test devices 21 located on the leftmost of the top surface of the mechanical frame 101 slides downward to bring along the electrical test assembly 29 of the first electrical test device 21 to slide downward and tightly press the connector 400 in the second locating groove 720 of the second transfer platform 72 which is located on the leftmost of the top surface of the mechanical frame 101. Simultaneously, the first sliding cylinder 251 drives the first fastening board 252 to slide rearward, and the second sliding cylinder 261 drives the second fastening board 262 to slide rearward so as to drive the docking element 27 to slide rearward. The docking element 27 of the first electrical test device 21 is inserted into and pulled out of the insertion hole 407 of the connector 400 three times so as to complete the plug test three times.

After the connector 400 is completed to proceed the plug test three times, the first sliding cylinder 251 of the first electrical test device 21 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And the vertical sliding cylinder 282 of the first electrical test device 21 slides upward to make the electrical test assembly 29 of the first electrical test device 21 depart away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The second workstation: the suction nozzle modules 90 transfer the connectors 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720.

At the moment, the first sliding cylinder 251 of the second electrical test device 22 adjacent to the first electrical test device 21 drives the first fastening board 252 to slide rearward, and the second sliding cylinder 261 drives the second fastening board 262 to slide rearward to drive the docking element 27 to slide rearward so as to make the docking element 27 of the second electrical test device 22 inserted into the insertion hole 407 of the connector 400. Simultaneously, the vertical sliding cylinder 282 of the second electrical test device 22 slides downward to bring along the electrical test assembly 29 of the second electrical test device 22 to slide downward and tightly press the connector 400 in the second locating groove 720 of the second transfer platform 72 so as to make the probes 293 contact with the first terminals 402, the second terminals 403, the third terminals 404 and the fourth terminals 405 of the connector 400 for realizing a conduction test of the connector 400.

After the connector 400 is completed to proceed the conduction test, the first sliding cylinder 251 of the second electrical test device 22 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And, the vertical sliding cylinder 282 of the second electrical test devices 22 slides upward to make the electrical test assembly 29 of the second electrical test devices 22 away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The third workstation: the suction nozzle modules 90 transfer the connectors 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720.

At the moment, the first sliding cylinder 251 of the second electrical test device 22 drives the first fastening board 252 to slide rearward, and the second sliding cylinder 261 drives the second fastening board 262 to slide rearward to drive the docking element 27 to slide rearward so as to make the docking element 27 of the second electrical test device 22 inserted into the insertion hole 407 of the connector 400. Simultaneously, the vertical sliding cylinder 282 of the second electrical test device 22 slides downward to bring along the electrical test assembly 29 of the second electrical test device 22 to slide downward and tightly press the connector 400 in the second locating groove 720 of the second transfer platform 72 so as to make the probes 293 contact with the first terminals 402, the second terminals 403, the third terminals 404 and the fourth terminals 405 of the connector 400 for realizing a withstanding voltage test of the connector 400.

After the connector 400 is completed to proceed the withstanding voltage test of the connector 400, the first sliding cylinder 251 of the second electrical test device 22 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And, the vertical sliding cylinder 282 of the second electrical test devices 22 slides upward to make the electrical test assembly 29 of the second electrical test devices 22 away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The fourth workstation: after the first workstation, the second workstation and the third workstation test, when the connector 400 generates an abnormal phenomenon, the second sliding cylinder 734 of the third transfer platform 73 slides forward so as to bring along the first retaining board 735 together with the first collecting box 738 to slide forward to make the suction nozzle modules 90 collect the defective connector 400 in the first collecting box 738. When the connector 400 has no abnormal phenomenon, the suction nozzle modules 90 transfer the connector 400 to the third locating groove 730 of the third transfer platform 73.

The fifth workstation: the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

At the moment, the first sliding cylinder 251 of the second electrical test device 22 drives the first fastening board 252 to slide rearward, and the second sliding cylinder 261 drives the second fastening board 262 to slide rearward to drive the docking element 27 to slide rearward so as to make the docking element 27 of the second electrical test device 22 inserted into the insertion hole 407 of the connector 400. Simultaneously, the vertical sliding cylinder 282 of the second electrical test device 22 slides downward so as to bring along the electrical test assembly 29 of the second electrical test device 22 to slide downward, and tightly press the connector 400 in the second locating groove 720 of the second transfer platform 72 so as to make the probes 293 contact with the light emitting diode 406 of the connector 400 for realizing an electrical performance test of the light emitting diode 406 of the connector 400.

After the connector 400 is completed to proceed the electrical performance test of the light emitting diode 406 of the connector 400, the first sliding cylinder 251 of the second electrical test device 22 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And, the vertical sliding cylinder 282 of the second electrical test devices 22 slides upward to make the electrical test assembly 29 of the second electrical test devices 22 depart away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The sixth workstation: after the connector 400 is completed to proceed the fifth workstation test, when the connector 400 has an abnormal phenomenon, the second sliding cylinder 734 of the next third transfer platform 73 slides forward so as to bring along the first retaining board 735 together with the first collecting box 738 to slide forward to make the suction nozzle modules 90 transfer the connectors 400 to the third locating groove 730 of the third transfer platform 73.

The seventh workstation: the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

At the moment, the first sliding cylinder 251 of the second electrical test device 22 drives the first fastening board 252 to slide rearward, and the second sliding cylinder 261 drives the second fastening board 262 to slide rearward to drive the docking element 27 to slide rearward so as to make the docking element 27 of the second electrical test device 22 inserted into the insertion hole 407 of the connector 400. Simultaneously, the vertical sliding cylinder 282 of the second electrical test device 22 slides downward so as to bring along the electrical test assembly 29 of the second electrical test device 22 to slide downward, and tightly press the connector 400 in the second locating groove 720 of the second transfer platform 72 so as to make the clamping portions 295 clamp the first terminal 402 of the connector 400 for completing a resistance test of the first terminal 402 of the connector 400.

After the connector 400 is completed to proceed the resistance test of the first terminal 402 of the connector 400, the first sliding cylinder 251 of the second electrical test device 22 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And, the vertical sliding cylinder 282 of the second electrical test device 22 slides upward to make the electrical test assembly 29 of the second electrical test device 22 depart away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The eighth workstation: the suction nozzle modules 90 transfer the connector 400 to the first transfer platform 71 and the connector 400 is limited in the first locating groove 717, in the eighth workstation, the first transfer platform 71 plays a conveying role, no test action is executed.

The ninth workstation: the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

At the moment, the first sliding cylinder 251 of the second electrical test device 22 drives the first fastening board 252 to slide rearward, and the second sliding cylinder 261 drives the second fastening board 262 to slide rearward to drive the docking element 27 to slide rearward so as to make the docking element 27 of the second electrical test device 22 inserted into the insertion hole 407 of the connector 400. Simultaneously, the vertical sliding cylinder 282 of the second electrical test device 22 slides downward to bring along the electrical test assembly 29 of the second electrical test device 22 to slide downward and tightly press the connector 400 in the second locating groove 720 of the second transfer platform 72 so as to make the clamping portions 295 clamp the second terminal 403, the third terminal 404 and the fourth terminal 405 of the connector 400 for completing a resistance test of the second terminal 403, the third terminal 404 and the fourth terminal 405 of the connector 400.

After the connector 400 is completed to proceed the resistance test of the second terminal 403, the third terminal 404 and the fourth terminal 405 of the connector 400, the first sliding cylinder 251 of the second electrical test device 22 slides forward along the first fastening board 252, and the second sliding cylinder 261 slides forward along the second fastening board 262 so as to bring along the docking element 27 to slide forward, and then the docking element 27 is withdrawn from the insertion hole 407 of the connector 400. And, the vertical sliding cylinder 282 of the second electrical test device 22 slides upward to make the electrical test assembly 29 of the second electrical test device 22 depart away from the second transfer platform 72. The first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The tenth workstation: after the ninth workstation test, when the connector 400 generates the abnormal phenomenon, the second sliding cylinder 734 of the third transfer platform 73 slides forward so as to bring along the first retaining board 735 together with the first collecting box 738 to slide forward to make the suction nozzle modules 90 collect the defective connector 400 in the first collecting box 738. When the connector 400 has no abnormal phenomenon, the suction nozzle modules 90 transfer the connector 400 to the third locating groove 730 of the third transfer platform 73.

The eleventh workstation: the suction nozzle modules 90 transfer the connector 400 to the first transfer platform 71 and the connector 400 is limited in the first locating groove 717, in the eighth workstation, the first transfer platform 71 plays a conveying role, no test action is executed. Then the suction nozzle modules 90 transfer the connectors 400 to the transmitting path 62 of the transmission mechanism 60 which is located on the right side of the top surface of the mechanical frame 101 where the electrical test devices 20 are disposed.

Referring to FIG. 1 to FIG. 18, the automatic test system 100 proceeds from the twelfth workstation to the twenty-first workstation mechanical performance tests for the connector 400 on the transfer platforms 70. Specifically, the suction nozzle modules 90 transfer the connector 400 limited in the first locating groove 717 of the first transfer platform 71 used in the eleventh workstation to the transmitting path 62 of the transmission mechanism 60 which is located on the leftmost of the top surface of the mechanical frame 101 where the mechanical test devices 30 are disposed.

The twelfth workstation: when the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

The cameras 35 of the mechanical test devices 30 photograph fronts of the first terminals 402, the second terminals 403, the third terminals 404 and the fourth terminals 405 to proceed dimension measurements of the fronts of the first terminals 402, the second terminals 403, the third terminals 404 and the fourth terminals 405 by virtue of the control system 106.

After the connector 400 is completed to proceed the dimension measurements of the first terminals 402, the second terminals 403, the third terminals 404 and the fourth terminals 405, the first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward to reset.

The thirteenth workstation: the suction nozzle modules 90 transfer the connector 400 to the first transfer platform 71 and the connector 400 is limited in the first locating groove 717.

The cameras 35 of the mechanical test devices 30 photograph rears of the first terminals 402, the second terminals 403, the third terminals 404, the fourth terminals 405 and the light emitting diode 406 to proceed dimension measurements of the rears of the first terminals 402, the second terminals 403, the third terminals 404, the fourth terminals 405 and the light emitting diode 406 by virtue of the control system 106.

The fourteenth workstation: the suction nozzle modules 90 transfer the connector 400 to the first transfer platform 71 and the connector 400 is limited in the first locating groove 717.

The cameras 35 of the mechanical test devices 30 photograph fronts of the first terminals 402, the second terminals 403, the third terminals 404 and the fourth terminals 405 to proceed dimension measurements of the fronts of the first terminals 402, the second terminals 403, the third terminals 404 and the fourth terminals 405 by virtue of the control system 106.

The fifteenth workstation: the suction nozzle modules 90 transfer the connector 400 to the next first transfer platform 71 and the connector 400 is limited in the first locating groove 717.

The cameras 35 of the mechanical test devices 30 photograph rears of the first terminals 402, the second terminals 403, the third terminals 404, the fourth terminals 405 and the light emitting diode 406 to proceed dimension measurements of the rears of the first terminals 402, the second terminals 403, the third terminals 404, the fourth terminals 405 and the light emitting diode 406 by virtue of the control system 106.

The sixteenth workstation: before the suction nozzle modules 90 transfer the connector 400 to the fourth transfer platform 74, the second piston cylinder 755 drives the third guiding mechanism 752 to move downward to drive the second pushing element 754 and the third blocking blocks 758 to move downward so as to push the second embedding elements 757 to move downward. The suction nozzle modules 90 transfer the connector 400 to the fourth transfer platform 74, the second piston cylinder 755 drives the third guiding mechanism 752 to move upward to drive the second pushing element 754 and the third blocking blocks 758 to move upward so as to push the second embedding elements 757 to move upward for limiting the connector 400 in the fourth locating groove 740 of the fourth transfer platform 74.

The cameras 35 of the mechanical test devices 30 photograph portions of the first terminals 402, the second terminals 403, the third terminals 404 and the fourth terminals 405 projecting into an inside of the insulating housing 401 from the insertion hole 407 to proceed bounce height measurements of the first terminals 402, the second terminals 403, the third terminals 404 and the fourth terminals 405 by virtue of the control system 106.

When the connector 400 generates an abnormal phenomenon, the second sliding cylinder 744 of the fourth transfer platform 74 slides forward so as to bring along the second retaining board 745 together with the second collecting box 748 to slide forward to make the suction nozzle modules 90 collect the defective connector 400 in the second collecting box 748. When the connector 400 has no abnormal phenomenon, the suction nozzle modules 90 transfer the connector 400 to the second locating groove 720 of the second transfer platform 72.

The seventeenth workstation: before the suction nozzle modules 90 transfer the connector 400 to the next second transfer platform 72, the first piston cylinder 728 of the second transfer platform 72 drives the first pushing element 727 and the first guiding mechanism 762 to move downward to make the first pushing element 727 push the first embedding elements 729, the first blocking blocks 764 and the second blocking block 766 to move downward so as to push the first embedding elements 729 to move downward. When the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

The cameras 35 of the mechanical test devices 30 photograph the portions of the first terminals 402, the second terminals 403, the third terminals 404 and the fourth terminals 405 projecting into an inside of the insulating housing 401 from the insertion hole 407 to proceed bounce height measurements of the first terminals 402, the second terminals 403, the third terminals 404 and the fourth terminals 405 by virtue of the control system 106.

After the connector 400 is completed to proceed the bounce height measurements of the first terminals 402, the second terminals 403, the third terminals 404 and the fourth terminals 405, the second piston cylinder 755 drives the third guiding mechanism 752 to move downward to drive the second pushing element 754 and the third blocking blocks 758 to move downward so as to push the second embedding elements 757 to move downward to reset.

The eighteenth workstation: the suction nozzle modules 90 transfer the connector 400 to the next second transfer platform 72, the first piston cylinder 728 of the second transfer platform 72 drives the first pushing element 727 and the first guiding mechanism 762 to move upward to make the first pushing element 727 push the first embedding elements 729, the first blocking blocks 764 and the second blocking block 766 to move upward so as to limit the connector 400 in the second locating groove 720 of the second transfer platform 72.

The cameras 35 of the mechanical test devices 30 photograph portions of the first terminals 402, the second terminals 403, the third terminals 404 and the fourth terminals 405 projecting into the inside of the insulating housing 401 from the insertion hole 407 to proceed bounce height measurements of the first terminals 402, the second terminals 403, the third terminals 404 and the fourth terminals 405 by virtue of the control system 106.

After the connector 400 is completed to proceed the bounce height measurements of the first terminals 402, the second terminals 403, the third terminals 404 and the fourth terminals 405, the second piston cylinder 755 drives the third guiding mechanism 752 to move downward to drive the second pushing element 754 and the third blocking blocks 758 to move downward so as to push the second embedding elements 757 to move downward to reset.

The nineteenth workstation: after the seventeenth workstation test and eighteenth workstation test, when the connector 400 generates an abnormal phenomenon, the second sliding cylinder 734 of the third transfer platform 73 slides forward so as to bring along the first retaining board 735 together with the first collecting box 738 to slide forward to make the suction nozzle modules 90 collect the defective connector 400 in the first collecting box 738. When the connector 400 has no abnormal phenomenon, the suction nozzle modules 90 transfer the connector 400 to the first locating groove 717 of the first transfer platform 71.

The twentieth workstation: the suction nozzle modules 90 transfer the connector 400 to the first locating groove 717 of the next first transfer platform 71, the cameras 35 of the mechanical test devices 30 photograph the first terminals 402, the second terminals 403, the third terminals 404 and the fourth terminals 405 from top to bottom to test a true position of the first terminals 402, the second terminals 403, the third terminals 404 and the fourth terminals 405 by virtue of the control system 106.

The twenty-first workstation: the suction nozzle modules 90 transfer the connector 400 to the next fourth transfer platform 74, the second piston cylinder 755 drives the third guiding mechanism 752 to move upward to drive the second pushing element 754 and the third blocking blocks 758 to move upward so as to push the second embedding elements 757 to move upward for limiting the connector 400 in the fourth locating groove 740 of the fourth transfer platform 74.

The laser device 40 lasers a date code on the connector 400.

When the connector 400 generates an abnormal phenomenon, the second sliding cylinder 744 of the fourth transfer platform 74 slides forward so as to bring along the second retaining board 745 together with the second collecting box 748 to slide forward to make the suction nozzle modules 90 collect the defective connector 400 in the second collecting box 748. When the connector 400 has no abnormal phenomenon, the suction nozzle modules 90 transfer the connector 400 to the placing device 80.

After completing the above-mentioned twenty-first workstation test, the suction nozzle modules 90 transfer the connector 400 to the rotating mechanism 85 of the placing device 80, the vertical drive cylinder 82 drives the mechanical fastening board 83, the rotating drive mechanism 84 and the rotating mechanism 85 to move upward, the rotating mechanism 85 grabs the connector 400 which is transmitted by the suction nozzle modules 90 of the moving device 105 and is completed to be tested and lasered, the rotating drive mechanism 84 drives the rotating mechanism 85 to rotate to place the connector 400 on the material strap of the panel portion 51 of the packing mechanism 50, and the receiving wheel 53 rotates, the material strap along the panel portion 51 to be transmitted forward, the packing tape wheel 54 transmits the adhesive tape to the pressing mechanism 56, the connector 400 is adhered between the material strap and the adhesive tape so as to complete the packing action. At last, the packed connector 400 goes on transmitting forward to the packing platform 52 of the packing mechanism 50 for looping the packed connectors 400 around the receiving wheel 53.

As described above, the automatic test system 100 proceeds the automatic test for the connector 400 by virtue of the electrical test devices 20 and the mechanical test devices 30 of the test device 102 so as to improve a test stability of the connector 400 and improve a test quality of the connector 400. Furthermore, the automatic test system 100 is able to proceed multiterm performance tests for saving manpower and test time for lowering a test cost.

What is claimed is:

1. An automatic test system for testing a connector, comprising:
    a mechanical frame;
    a test device mounted to the mechanical frame for testing the electrical performance and the mechanical performance of the connector;
    a packing device mounted to the mechanical frame for packing the connector which is completed to be tested;
    a transmission device mounted to the mechanical frame for transmitting the connector to each workstation of the test device and the packing device;

a moving device mounted to the mechanical frame for moving the connector to each workstation of the test device and the packing device corresponding to the transmission device; and a control system electrically connected with and controlling the test device, the packing device, the transmission device and the moving device for completing the transmission, test and packing action of the connector.

2. The automatic test system as claimed in claim 1, wherein the test device includes a plurality of electrical test devices and mechanical test devices, the electrical test devices and the mechanical test devices are disposed to the mechanical frame in sequence.

3. The automatic test system as claimed in claim 2, wherein the electrical test devices include at least one first electrical test device, at least one second electrical test device and at least one third electrical test device, each of the electrical test devices includes a test platform mounted on a top surface of the mechanical frame, a first longitudinal transporting mechanism slidably assembled to a top of the test platform, a second longitudinal transporting mechanism slidably assembled to one side of a top of the first longitudinal transporting mechanism, a docking component assembled to a rear of the second longitudinal transporting mechanism, a vertical transporting mechanism slidably assembled to the other side of the top of the first longitudinal transporting mechanism, and an electrical test assembly assembled to the vertical transporting mechanism.

4. The automatic test system as claimed in claim 3, wherein the first longitudinal transporting mechanism includes a first sliding cylinder disposed on a top surface of the test platform, and a first fastening board disposed on a top of the first sliding cylinder, the second longitudinal transporting mechanism includes a second sliding cylinder disposed on a top surface of the first fastening board, a second fastening board disposed on a top of the second sliding cylinder, and a docking element fastened to one side of a rear of the second fastening board, the vertical transporting mechanism includes a vertical fastening board fastened to the other side of the first fastening board, a vertical sliding cylinder disposed to a rear surface of the vertical fastening board, and a third fastening board disposed to a rear of the vertical sliding cylinder.

5. The automatic test system as claimed in claim 4, wherein the first electrical test devices are respectively for proceeding an insertion-withdrawal performance test of the connector, and the electrical test assembly of the first electrical test device is fastened to one side of the third fastening board and located above the docking element.

6. The automatic test system as claimed in claim 4, wherein the three second electrical test devices are respectively for proceeding a conduction performance test, a high-voltage insulation test and a light emitting diode electricity test, the electrical test assembly of the second electrical test device includes a fastening component fastened to the one side of the third fastening board, a probe holder fastened under the fastening component, and a plurality of probes fastened to the probe holder and exposed beyond a top of the probe holder.

7. The automatic test system as claimed in claim 4, wherein the electrical test assembly of the third electrical test device includes a fastening component fastened to the one side of the third fastening board, two third sliding cylinders disposed to two opposite sides of a bottom of the fastening component, and a plurality of clamping portions disposed between the two third sliding cylinders.

8. The automatic test system as claimed in claim 2, wherein the mechanical test devices include at least one first mechanical test device, at least one second mechanical test devices and at least one third mechanical test device, each of the mechanical test devices includes a camera bracket mounted to the mechanical frame, and a camera disposed to the camera bracket.

9. The automatic test system as claimed in claim 8, wherein each of the first mechanical test devices and each of second mechanical test devices respectively further include a ball bearing lead screw connected with a front end of the camera, and a step motor connected with a front end of the ball bearing lead screw.

10. The automatic test system as claimed in claim 2, wherein the transmission device includes a plurality of transmission mechanisms and a plurality of transfer platforms, each of the transmission mechanisms includes a transmitting bracket assembly mounted to the mechanical frame, a transmitting path disposed above the transmitting bracket assembly, and a transmitting motor disposed to one side of the transmitting bracket assembly for driving the transmitting path, the two transmission mechanisms which are respectively located on a left side of a top surface of the mechanical frame where the electrical test devices are disposed, and located on a left side of the top surface of the mechanical frame where the mechanical test devices are disposed respectively further include a static fan mounted above the transmitting bracket assembly and spaced from a top of the transmitting bracket and the transmitting path for eliminating statics of the connector.

11. The automatic test system as claimed in claim 10, wherein the transfer platforms include a plurality of first transfer platforms, a plurality of second transfer platforms, a plurality of third transfer platforms and a plurality of fourth transfer platforms.

12. The automatic test system as claimed in claim 11, wherein each of the first transfer platforms has a first bottom board, a first connecting board disposed above the first bottom board, a first bearing platform disposed above the first connecting board, a first blocking board disposed above a front end of the first bearing platform, two first buckling boards disposed to two opposite sides of the first bearing platform and located in rear of the first blocking board, and a first locating board disposed above the first blocking board, a top of the first blocking board defines a first locating groove for locating the connector.

13. The automatic test system as claimed in claim 11, wherein each of the second transfer platforms has a second bottom board, a second connecting board, a second bearing platform, a second blocking board, two second buckling boards, a top of the second blocking board defines a first fastening groove, a first holding board, a first guiding mechanism, a second holding board, a first pushing element, a first piston cylinder, a first connecting element, a plurality of first embedding elements, two first blocking blocks, two second guiding mechanisms and a second blocking block, the second transfer platform further includes two ejecting pins and two first intake tubes, tops of the first embedding elements surround a second locating groove for locating the connector.

14. The automatic test system as claimed in claim 11, wherein each of the third transfer platforms has a third bottom board, a third connecting board, a third bearing platform, a second sliding cylinder, a first retaining board, a third blocking board, two third buckling boards, a first collecting box and a third locating board, a top of the third locating board defines a third locating groove for locating the connector, the second sliding cylinder is able to slide forward and rearward along the third bearing platform to make defective connectors collected in the first collecting box.

15. The automatic test system as claimed in claim 11, wherein each of the fourth transfer platforms has a fourth bottom board, a fourth connecting board, a fourth bearing platform, a second sliding cylinder, a second retaining board, a fourth blocking board, two fourth buckling boards, a second collecting box, a top of the fourth blocking board defines a second fastening groove, a third holding board, a third guiding mechanism, a third fastening board, a second pushing element, a second piston cylinder, a second connecting element, a plurality of second embedding elements, two third blocking blocks, two fourth guiding mechanisms, and a fourth blocking block, the fourth transfer platform further includes two second ejecting pins and two second intake tubes, tops of the second embedding elements surround a fourth locating groove for locating the connector.

16. The automatic test system as claimed in claim 10, wherein the transmission device further includes a placing device mounted to the mechanical frame, the placing device is disposed between the right of the transfer platforms corresponding to the mechanical test device and the packing mechanism, the placing device includes a mechanical supporter assembly mounted to the mechanical frame, a vertical drive cylinder disposed to the mechanical supporter assembly, a mechanical fastening board connected to and driven by the vertical drive cylinder to move upward and downward, a rotating drive mechanism fastened to the mechanical fastening board, and a rotating mechanism driven by the rotating drive mechanism to rotate and place the connector.

17. The automatic test system as claimed in claim 10, wherein the moving device located in rear of the transmission device includes a plurality of suction nozzle modules, each of the suction nozzle modules defines a plurality of suction nozzles arranged at regular intervals, an interval between each two suction nozzles is corresponding to a spaced distance between each two transfer platforms.

18. The automatic test system as claimed in claim 1, wherein the packing device includes a packing mechanism mounted to a top surface of the mechanical frame and located at a right side of the test device, the packing mechanism includes a panel portion mounted to the mechanical frame, a packing platform mounted to the panel portion, a receiving wheel and a packing tape wheel oppositely disposed in front and in rear of the packing platform, an adhesive tape wheel disposed above the packing platform, the receiving wheel and the packing tape wheel, and a pressing mechanism disposed in front of the packing platform and located among the packing platform, the receiving wheel and the adhesive tape wheel.

19. The automatic test system as claimed in claim 18, wherein the packing device further includes a laser device disposed at a rear of the transmission device adjacent to the packing mechanism for lasering a date code on the connector.

20. The automatic test system as claimed in claim 1, wherein the connector is an audio receptacle connector, and includes an insulating housing, a plurality of first terminals, second terminals, third terminals, fourth terminals and a light emitting diode disposed to the insulating housing, the connector defines an insertion hole, and a docking element of the test device is an audio plug.

\* \* \* \* \*